United States Patent [19]

Mastroianni

[11] Patent Number: 4,641,130
[45] Date of Patent: Feb. 3, 1987

[54] ANALOG-TO-DIGITAL CONVERTER WITH SCALING OF INPUT SIGNAL

[75] Inventor: Anthony R. Mastroianni, Bridgewater Township, Somerset County, N.J.

[73] Assignee: RCA Corporation, Princeton, N.J.

[21] Appl. No.: 717,827

[22] Filed: Mar. 29, 1985

[51] Int. Cl.$^4$ ............................................. H03M 1/18
[52] U.S. Cl. ............................................. 340/347 AD
[58] Field of Search ................ 340/347 AD, 347 MT; 329/99 D

[56] References Cited

U.S. PATENT DOCUMENTS

| | | | |
|---|---|---|---|
| 4,348,658 | 9/1982 | Carter | 340/347 AD |
| 4,381,496 | 4/1983 | Carter | 340/347 AD |
| 4,404,544 | 9/1983 | Dwarakanath | 340/347 AD |
| 4,517,549 | 5/1985 | Tsukakoshi | 340/347 AD |

OTHER PUBLICATIONS

"Capacitors Make Stable Converts" Jun. 7, 1979, p. 136, *Electronics*.
"Special Report: The Inside News on Data Converters" Jul. 17, 1980, pp. 101–112, *Electronics*.

*Primary Examiner*—Charles D. Miller
*Attorney, Agent, or Firm*—Joseph S. Tripoli; Henry I. Schanzer

[57] ABSTRACT

A charge-redistribution successive-approximation analog-to-digital converter includes means for scaling an unknown analog input voltage ($V_{IN}$) whose maximum rated value is greater than the precision reference voltage ($V_{REF}$) of the converter. The unknown input voltage is applied to selected charge storing means, forming the charge-redistribution network, during a sampling interval. Subsequently, the charge on the selected charge storing means is distributed to additional charge storing means to produce the desired degree of scaling. The scaling factor is proportional to the ratio of $V_{REF}$ to the maximum rated value of $V_{IN}$.

11 Claims, 5 Drawing Figures

ANALOG-TO-DIGITAL CONVERTER WITH SCALING OF INPUT SIGNAL

This invention relates to analog-to-digital (A/D) converters, and in particular, to A/D converters of the charge-redistribution successive-approximation type.

Typically, in A/D converters using charge redistribution, a capacitor (or capacitors) is charged with an unknown analog input voltage during a sample phase, and retains the value during a subsequent conversion phase. During the conversion phase, the unknown voltage is compared in a series of successive approximations with a precision reference voltage. A problem in known successive-approximation A/D converters is that a precision voltage reference, such as a bandgap voltage reference, manufactured on, and as part of, an integrated circuit (IC), cannot be easily implemented to equal the supply voltage to the converter. By way of example, an A/D converter operated with a supply voltage of +5 volts, may have a precision reference voltage which is 4 volts or less. In known applications this limits the range of unknown analog input voltages that can be measured to 4 volts, or less. However, where the operating potential is, for example, 5 volts, it is desirable to be able to measure unknown analog input voltages which extend over the full range (e.g. 5 volts) spanned by the operating potential.

Accordingly, in circuits embodying the invention, an unknown analog input voltage whose maximum amplitude exceeds the value of the precision reference voltage is scaled down, and the scaled down value of the analog input voltage is compared to the precision reference voltage. The scaling factor is a ratio of the maximum rated value of the unknown input voltage to the value of the precision reference voltage. Scaling enables measurements of an unknown analog input voltage whose value exceeds the precision reference and to make these measurements transparent to the user.

In the accompanying drawing, like reference characters denote like components; and FIG. 1 is a simplified schematic diagram of an analog-to-digital converter circuit embodying the invention;

Figure 1:
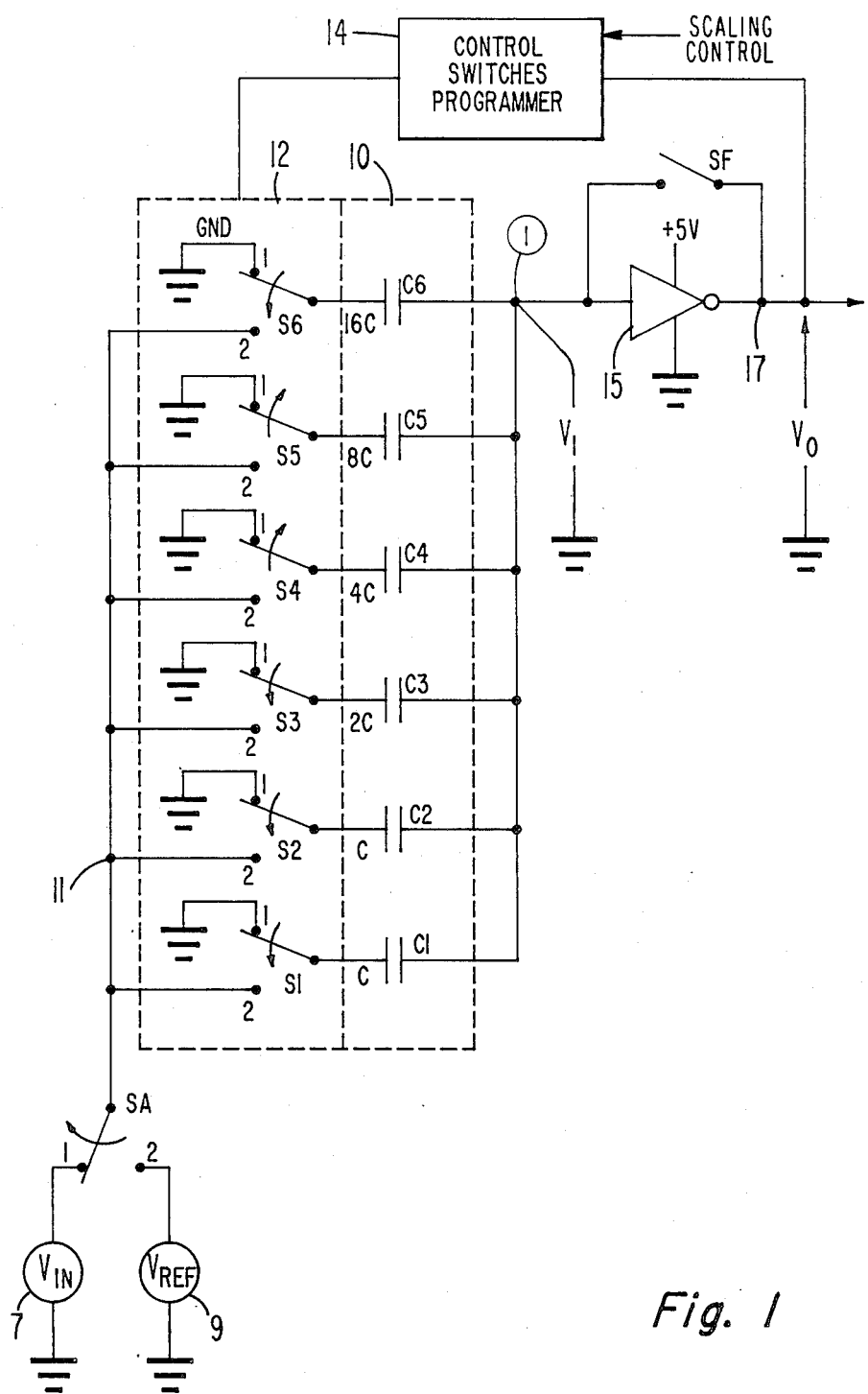

FIG. 1 shows a binary weighted capacitive ladder network 10 comprised of 6 capacitors, C1 through C6 and a set 12 of control switches comprised of switches S1 through S6 whose settings are determined by a control switch programmer 14. Each capacitor (Ci) is connected at one end (terminal, plate, or side) to a node 1 and at its other end to a corresponding single pole double throw control switch (S1–S6). For ease of reference, in the discussion to follow, a capacitor terminal connected to a control switch (S1–S6) is also referred to as an "input" terminal and a capacitor terminal connected to node 1 is also referred to as an "output" terminal. There is one control switch (Si) per capacitor (Ci) and each control switch (S1 through S6) may be selectively switched to either: a) a position 1 to which is applied ground potential; or b) a position 2 which is connected via a conductor 11 to a single pole double throw switch SA. A source 7 of unknown analog input voltage ($V_{IN}$) to be measured is connected to position 1 of switch SA and a precision reference voltage ($V_{REF}$) source 9 is connected to position 2 of switch SA. Switch SA is then used to selectively apply either $V_{IN}$ or $V_{REF}$ to conductor 11. By way of example, $V_{REF}$ is equal to 3.2 volts and the maximum rated value of $V_{IN}$ is 5.12 volts.

Capacitors C1, C2, C3, C4, C5 and C6 are binary weighted. Capacitors C1 and C2 are each assumed to have unity capacitance (1·C); C3 has a value of 2·C, C4 has a value of 4·C, C5 has a value of 8·C and C6 has a value of 16·C. Thus, capacitor C3 represents the same amount of capacitance as capacitor C1 and C2 combined; C4 represents the same amount of capacitance as capacitors C1, C2 and C3 combined; C5 represents the same amount of capacitance as capacitors C1, C2, C3 and C4 combined; and capacitor C6 represents the same amount of capacitance as capacitors C1, C2, C3, C4 and C5 combined.

A comparator 15, which functions as an inverting means, is connected at its input to node 1, and a feedback switch (SF) is connected between node 1 and the output 17 of the comparator. Assume by way of example, that the operating potential ($V_{DD}$) applied to comparator 15 is +5 volts and that the comparator output is symmetrical. Assume further that, when switch SF is closed, the comparator is "auto-zeroed" whereby the voltage (V1) at node 1 goes to, and is held at, 2.5 volts (i.e., $V_{DD}/2$).

It will be shown that the input voltage may be scaled by charging a preselected number (i.e. less than all) of the capacitors of network 10 to $V_{IN}$, during a sampling phase, and then, following the sampling phase, redistributing the charge across all the capacitors of network 10. This is accomplished by appropriately programming the settings of control switches S1 through S6. Assume for example, that, as shown in FIG. 1, switch SA is in its position 1 whereby $V_{IN}$ is applied to conductor 11 and to position 2 of the control switches (S1–S6). Assume further, that switches S1, S2, S3 and S6 are placed in their position 2 while switches S4 and S5 are placed in their position 1. Consequently, the "input" terminals of capacitors C1, C2, C3 and C6 are charged to $V_{IN}$ volts while the "input" terminals of capacitors C4 and C5 are at ground potential. Defining $C_A$ as the total capacitance of capacitors C1, C2, C3 and C6, connected in parallel between nodes 1 and line 11, the additional signal charge ($Q_T$) stored on C1, C2, C3 and C6, while $V_{IN}$ is applied during the sampling phase (i.e. $S_A$ in position 1), may be expressed as follows:

$$Q_T = V_{IN} \cdot C_A \qquad \text{eq. 1}$$

For the example above, $C_A$ is equal to C1+C2+C3+C6, which adds up to 20·C; where C is a unit of capacitance. Therefore, for the condition shown in FIG. 1, $Q_T$ may be expressed as:

$$Q_T = V_{IN} \cdot [20C] \qquad \text{eq. 2}$$

Following the charging of capacitors C1, C2, C3 and C6 to $V_{IN}$ as described above, switches S1, S2, S3 and S6 are driven or placed in their position 1. Capacitors C1 through C6 are now connected in parallel between node 1 and ground and the total capacitance ($C_T$) of network 10 is equal to 32C. However the total charge ($Q_T$) on the capacitive ladder network is preserved and remains equal to $V_{IN} \cdot [20C]$. The voltage ($V_X$) developed across the capacitive network 10 due to the redistribution of the charge $Q_T$ may be calculated from the following relationship:

$$Q_T = V_X \cdot 32C = V_{IN} \cdot 20C \qquad \text{eq. 3}$$

The value of $V_X$ in terms of $V_{IN}$ may then be expressed as:

$$V_X = [\tfrac{5}{8}] V_{IN} \qquad \text{eq. 4}$$

Clearly, for the condition where $V_{IN}$ is applied to capacitors C1, C2, C3 and C6 during the sampling phase, and where C1, C2, C3 and C6 are subsequently connected in parallel with C4 and C5, a voltage, $V_X$, which is $\tfrac{5}{8}$ of $V_{IN}$ is produced across the capacitive network.

Thus, during a sampling phase, $V_{IN}$ is applied to selected ones of the capacitors of the network, whose total capacitance may be expressed as $C_A$. Subsequently, during a scaling or conversion phase, all the capacitors of the ladder network 10 are connected in parallel producing a total capacitance $C_T$, which is greater than $C_A$. During this latter phase, $V_{IN}$ is scaled down by the ratio of $C_A$ to $C_T$, i.e. $C_A/C_T$. Hence, the input voltage is scaled down by charge redistribution between the capacitors (e.g. C1, C2, C3 and C6) selected to be charged to $V_{IN}$ and the total capacitance (C1–C6) of the network 10.

It should be evident that many different scaling factors may be generated, other than the one illustrated in FIG. 1 and discussed above. For example, if during a sampling phase, the "input" terminal of C1 were grounded, while $V_{IN}$ was applied to the "input" terminals of all the other capacitors of network 10, then $V_X$ would be equal to $V_{IN} \cdot [31/32]$. On the other hand, if, during a sampling phase, the "input" terminals of C2 through C6 were grounded and $V_{IN}$ was applied only to the input terminal of C1, then the scaling factor would be 1/32 and $V_X$ would be equal to $V_{IN} \cdot [1/32]$.

Thus, in circuits embodying the invention, there is a sampling phase, during which an unknown analog input voltage ($V_{IN}$) is applied to selected capacitors of a capacitive ladder network 10, charging them to $V_{IN}$. Subsequently, the input signal is scaled down by connecting all the capacitors of the ladder network 10 in parallel, i.e. the selected capacitors are connected in parallel with the previously non-selected capacitors. Where the total capacitance of the ladder network is $C_T$ and the capacitance of the selected capacitors during the sampling phase is $C_A$, the scaling factor is equal to the ratio of $C_A$ to $C_T$. Thus, a scaled down voltage $V_X$ is produced which is equal to $V_{IN} \cdot [C_A/C_T]$. The scaled voltage is then compared to binary weighted functions of $V_{REF}$ to determine the value of $V_X$ and $V_{IN}$.

The conversion of the scaled down analog voltage level into a digital value will now be described briefly and it will be shown that the value of $V_{IN}$ is determined while the down scaling is rendered transparent to the user.

During the sampling phase, switch SF is closed causing the voltage at nodes 1 and 17 to be at, or close to, $V_{DD}/2$. At the end of the sampling phase, assume that switch SF is opened and that, concurrently therewith, switches S1, S2, S4 and S6 are thrown to position 1, to which ground is applied, with S3 and S4 remaining at position 1 (i.e. grounded). Thus, at the termination of the sampling mode, the "input" terminals of capacitors C1 through C6 are grounded, causing $V_{IN}$ to be scaled down to $V_X$, as discussed above. Grounding the "input" terminals of C1 through C6 causes a voltage of $(-)V_X$ to be produced at node 1. This voltage (i.e. $-V_X$) subtracts from the direct current (D.C.) level of $V_{DD}/2$ at node 1. Thus, at the termination of the sampling phase, with SF opened and switches S1–S6 grounded, the voltage, V1, at node 1 goes from $V_{DD}/2$ to $[V_{DD}/2] - V_X$.

The value of $V_X$ is then determined by comparing $V_X$ to binary functions of $V_{REF}$ in a series of successive approximations. This technique is known and need not be greatly detailed. The sequence is initiated by throwing switch $S_A$ to position 2 to apply $V_{REF}$ to conductor 11. Switch S6 is then placed in position 2 to apply $V_{REF}$ to the "input" terminal of C6. The remaining switches (S1 through S5) remain in position 1 whereby the input terminals of their corresponding capacitors remain grounded. Since C6 has the same capacitance as the remaining capacitors of network 10 combined, the application of $V_{REF}$ to C6 causes V1 to rise by a value equal to $V_{REF}/2$. Thus, V1 is now equal to:

$$V1 = [(V_{DD}/2) - V_X + (V_{REF}/2)] \text{ volts}. \qquad \text{step 1}$$

Depending on the value of $V_X$, V1 will either be below 2.5 volts (i.e. $V_{DD}/2$) or above 2.5 volts. When V1 is below 2.5 volts, it indicates that $V_X$ is greater than $V_{REF}/2$. When V1 is above 2.5 volts, it indicates that $V_X$ is less than $V_{REF}/2$. For the condition where V1 is less than 2.5 volts, the output (Vo) of comparator 15 is driven positively above 2.5 volts while for V1 greater than 2.5 volts, Vo is driven below 2.5 volts. Note that with SF open the comparator functions as an inverting buffer with a relatively large voltage gain. Thus, very small offsets (below, or above, $V_{DD}/2$) at the input of the comparator will cause Vo to be driven high or low, respectively. For the first step, where $V_{REF}/2$ is added to V1, a "high" Vo output indicates that $V_X$ is greater than $V_{REF}/2$ while a "low" Vo output indicates $V_X$ is less than $V_{REF}/2$. The output (Vo) of the comparator is fed to programmer 14 which includes sensing, control and programming logic circuitry (not shown in detail) to sense the state of Vo and in response thereto continue a sequence of successive approximations, in addition to the step already described, which will determine the value of $V_X$ within a predetermined range.

For the example of FIG. 1, which depicts a 5 bit conversion scheme, conversion from the analog input to a digital value is effectuated by applying $V_{REF}$ to capacitors C6 to C2 successively, in descending order. At the first step of the successive approximations, $V_{REF}$ is applied to the "input" terminal of the largest capacitor (e.g. C6) producing a voltage step at node 1 of $V_{REF}/2$. The value of $V_X$ is then compared to $V_{REF}/2$ with the comparator output indicating whether $V_X$ is greater, or less, than $V_{REF}/2$. The programmer 14 senses the comparator output, stores the information in storage elements (not shown) and produces a binary output which represents the most significant binary bit (MSB) corresponding to the analog value of $V_X$. At the second step, $V_{REF}$ is applied to the "input" terminal of the next smaller capacitor (e.g. C5) producing a positive voltage step at node 1 of $V_{REF}/4$. In addition, and concurrently therewith, at step 2, the "input" terminal of C6 is either maintained at $V_{REF}$ or is grounded, depending on the value of V1 measured during step 1. In brief, in the course of the first step, $V_{REF}/2$ is added to V1 which was previously equal to $[V_{DD}/2] - V_X$. The resultant V1 is applied to a comparator 15 and drives the output of comparator 15 low, or high, in response to the resultant V1 being, respectively, greater, or less, than $V_{DD}/2$. The comparator output is then used in the course of the second step to either switch the input terminal of C6 to ground or to have it connected to $V_{REF}$ thereby either subtracting $V_{REF}/2$ from V1 or keeping the $V_{REF}/2$ step at V1. The subtraction or maintenance of $V_{REF}/2$ effectively sets the polarity of the voltage step applied to V1. At the second step, depending on the previous level of V1, $(+) V_{REF}/4$ or $(-) V_{REF}/4$ is "effectively" added to the resultant V1 from step 1 and the new V1 is applied to comparator 15 and the output is again examined. This process is repeated until $V_{REF}$ is successively applied to all the binary weighted capacitors with the "effective" polarity of the voltage step generated at each succeeding step being a function of whether the previous value of V1 was greater or less than $V_{DD}/2$ as indicated by the output of the comparator. When V1 is less than $V_{DD}/2$, the comparator causes the next voltage step to add to the previous value of V1. When V1 is greater than $V_{DD}/2$ the comparator causes the next voltage step to be subtracted from V1.

In general, as is well known, the conversion of $V_X$ occurs in a number of steps, each step defining $V_X$ within a smaller known voltage range and the different bits of $V_X$ determined at each step are stored in storage elements (e.g. flip-flops) not shown. In a 5 bit system the resolution of each final increment is within 1/32 of $V_{REF}$, in a 10 bit system the resolution of each increment is within 1/1024 of $V_{REF}$.

After the last step, the output of the comparator/programmer combination produces a binary number whose length (or resolution) is a function of the number of bits in the system. For example, in a 5 bit system, the binary output will range between 00000 (indicating a $V_X$ having an analog value of less than 1/32 of $V_{REF}$) and 11111 indicating a $V_X$ having an analog value above 31/32 $V_{REF}$. The binary output thus gives the range of $V_X$ as a function of $V_{REF}$. Since the scaling factor is known, $V_{IN}$ is uniquely determined.

Conversion techniques are well known in the art. See, for example, an article entitled—All-MOS Charge Redistribution Analog-to-Digital Conversion Techniques-Part 1, by James J. McCreary and Paul R. Gray, IEEE Journal of Solid State Circuits December, 1975, pp. 113-121. The conversion technique therefore need not be further detailed.

Figure 2:
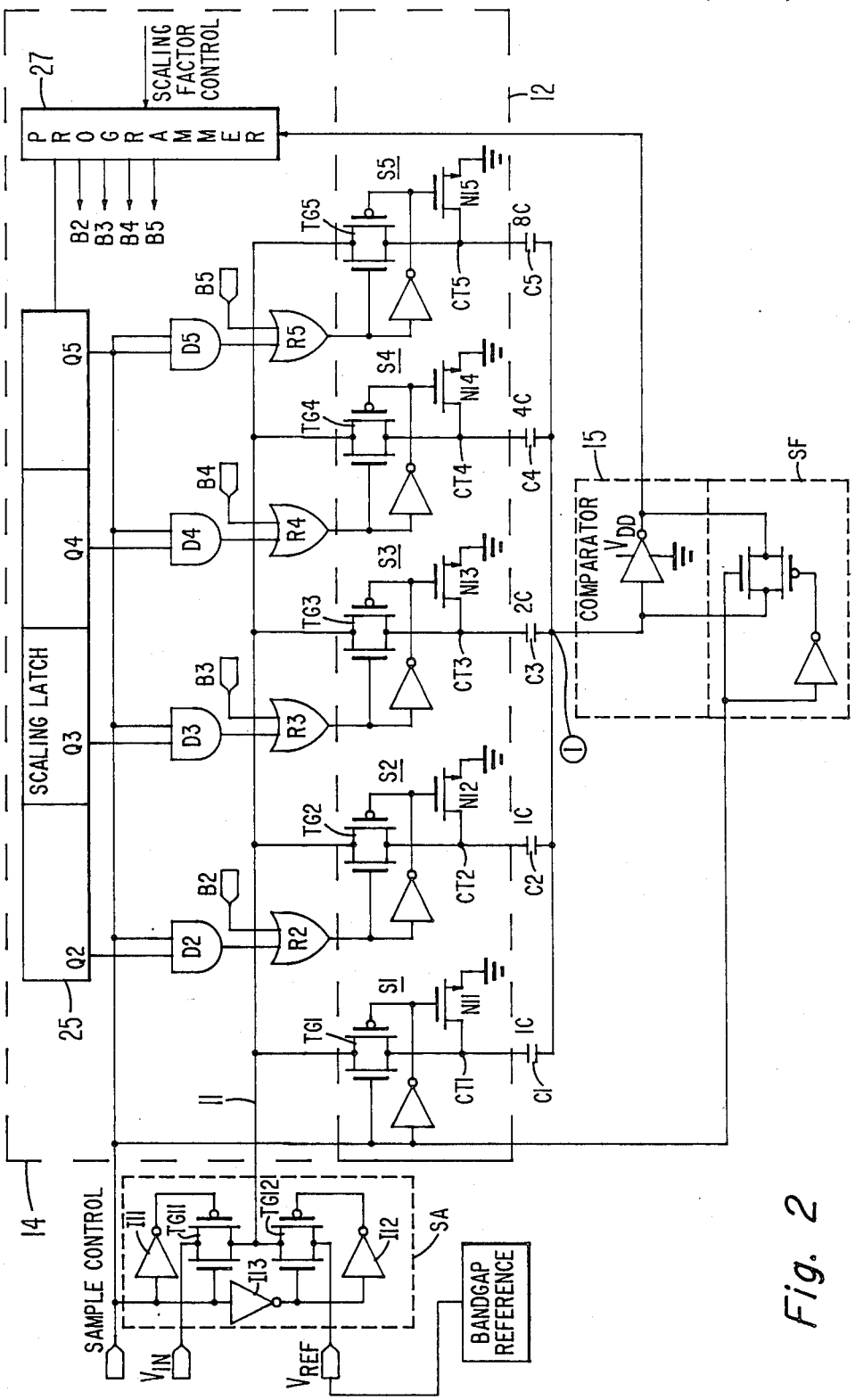
FIG. 2 is a more detailed schematic diagram of a circuit embodying the invention.
Figure 3:
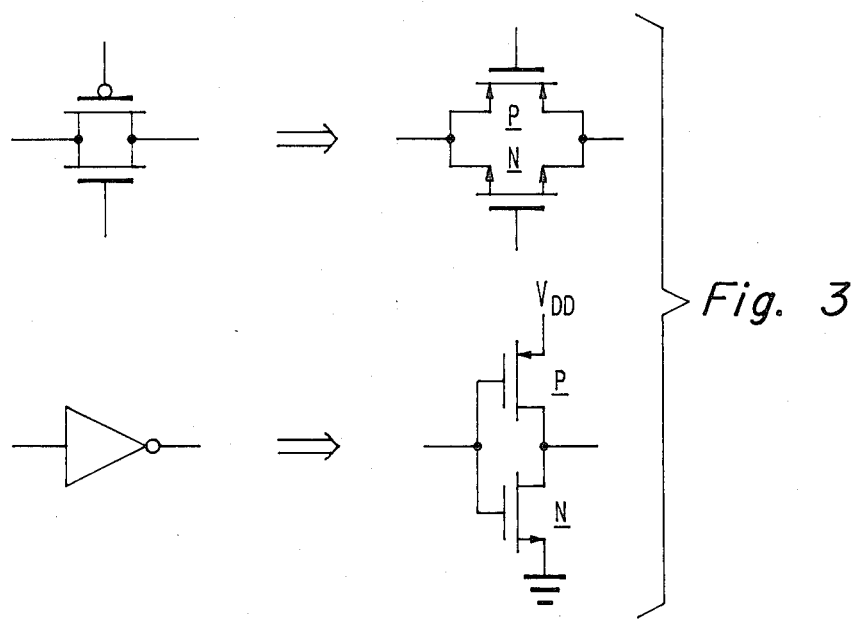
FIGS. 3A and 3B are detailed schematic diagrams of a complementary transistor transmission gate and of a complementary inverter, respectively, useful in practicing the invention.

The circuitry of FIG. 1 is shown in greater detail in FIG. 2. For example, switch SA includes two complementary transistor transmission gates TG11 and TG12 and three complementary inverters I11, I12 and I13. The structure of the complementary transmission gates and of the complementary inverters is detailed in FIG. 3. Switch SA is driven by a sample control signal of the type shown in FIG. 4. When the sample control signal is high, the circuit is in its input signal sampling phase or mode. Gate TG11 is enabled and couples the analog input voltage ($V_{IN}$) to conductor 11. During the sampling phase, gate TG12 is disabled. When the sample control signal goes low, TG12 is enabled and TG11 is disabled. The enabling of TG12 couples the bandgap reference voltage ($V_{REF}$) onto node 11. Typically, the circuit is a monolithic IC and the bandgap reference voltage is produced on, and is part of, the IC. After the sample control signal goes low, the input voltage is scaled down. The scaled down value is then compared to the value of $V_{REF}$ to determine the value of $V_{IN}$ by a series of successive approximation (i.e. conversion) which provides a digital value of $V_{IN}$. In the circuit of FIG. 2, the scaling and the first comparison are done in the same step.

The control switches S1 through S6 of FIG. 1 are implemented in FIG. 2 by means of a complementary transistor transmission gate TGi, an inverter, and a clamping transistor Nli.

Control switches programmer 14 of FIG. 1 is shown in FIG. 2 to include a scaling latch 25, comprised of flip-flops to store the scaling information digital circuitry responsive to the sample control signal and to respective outputs of scaling latch 25, and a programmer 27 which controls the setting of the flip-flops in scaling latch 25 and provides a series of signals (B2-B5) which control the turn-on and turn-off of the control switches (S1-S5) during the conversion phase.

The first switch (S1) of the A/D converter includes a transmission gate TG1 which is enabled when the sample is high and which is disabled when the sample is low. When TG1 is enabled, whatever signal is present on line 11 is coupled to node CT1 to which the "input" terminal of C1 is connected. The remaining switches (S2-S5) of the A/D converter are controlled by means of scaling latch 25 which is preset to a selective condition by means of a programmer circuit 27. The programmer circuit 27 sets the scaling latch to the preselect condition in response to a scaling factor control signal applied to its input. In FIG. 2, four latch outputs (Q2, Q3, Q4 and Q5) are shown. Each latch output is applied to one input of a corresponding two input AND gate (Di). The other input to each of the Di gates is the sample control signal. The output (ODi) of each AND gate is applied to one input of a two input OR gate (Ri). The second input Bi to each OR gate is supplied by programmer 27.

The output ORi of each OR gate is coupled directly and via an inverter to the control electrode of a complementary transistor transmission gate TGi, whereby when the output (ORi) of the gate Ri is high its corresponding transmission gate TGi is turned-on and when the ORi is low, the corresponding TGi is turned-off. When the output (ORi) of an OR gate Ri goes low, turning-off its associated transmission gate, a high signal is applied to the gate electrode of a corresponding transistor Nli which functions to ground the node CTi to which the "input" terminal of the corresponding capacitor Ci is connected.

Figure 4:
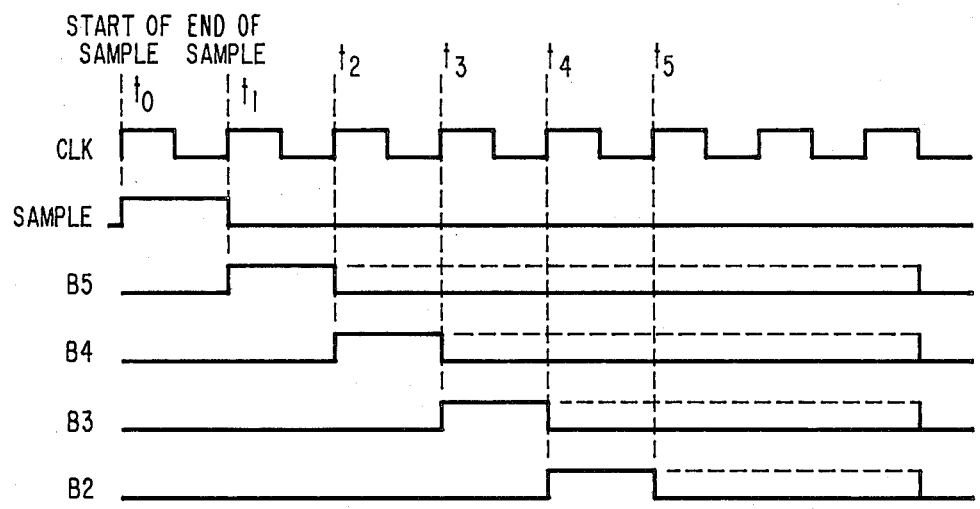
FIG. 4 is a diagram of control signals associated with the circuit of FIG. 2.

The operation of the circuitry is briefly as follows:

Assume, for example, that prior to sampling the input voltage $V_{IN}$, programmer 27 sets the scaling latch 25 such that Q3 and Q4 are low while Q2 and Q5 are high. Consequently, when the sample control signal goes high, at time $t_o$ as shown in FIG. 4, the outputs, OD2, of D2 and, OD5, of D5 go high while the outputs, OD3, of D3 and, OD4, of D4 remain low. Assume also, as shown in FIG. 4, that, during the sampling phase, the conversion control signals B2-B5 are low. Accordingly, the outputs, OR2, of R2 and, OR5, of R5 will be high while the outputs, OR3 and OR4, of R3 and R4, respectively, will be low.

The "high" sample control signal and the high outputs of R2 and R5 turn-on TG1, TG2, and TG5 which allow the "input" side of C1, C2 and C5 to be charged to $V_{IN}$. The "low" outputs of R3 and R4 disable TG3 and TG4 and turn-on N13 and N14 which ensures that the "input" side of C3 and C4 are grounded. At the end of the sampling interval the sample control signal goes low as shown at time $t_1$ in FIG. 4. When this occurs, TG11 is turned-off and TG12 is turned-on applying $V_{REF}$ to line 11. Concurrently all the AND gates D2–D5 are turned-off and their outputs tend to go low.

After the sampling control signal goes low, the conversion control signals B5 through B2 go high successively as shown in FIG. 4. At time $t_1$ $V_{REF}$ is applied to line 11 and is turned-on (or maintained ON) ensuring that node 1 is then raised by $+V_{REF}/2$. The "input" side of the other capacitors is returned to AC ground. Thus, although $V_{REF}$ is applied via TG5 to the "input" side of C5, the input side of C5 is returned via the source impedance of the $V_{REF}$ source to alternating current (AC) ground whereby for AC and charge distribution considerations C5 is in parallel with the other capacitors of the ladder network. Thus, the voltage produced at node 1 is indeed equal to $[V_{DD}/2]-V_X+[V_{REF}/2]$.

As was the case for the circuit of FIG. 1, after the completion of the first step, programmer 27 supplies a B4 high control signal at time $t_2$ as shown in FIG. 4, which causes $V_{REF}$ to be applied to the input terminal of the next lower capacitor (e.g. C4) to produce an additional positive step (of $V_{REF}/4$) at node 1. If as a result of the first step the output of the comparator is high, B5 remains high as shown by dashed lines in FIG. 4. On the other hand, if the output of the comparator is low, B5 goes low at time $t_2$ causing the input terminal of capacitor C5 to be grounded and nulling out the previously applied step of $V_{REF}/2$ to V1. Concurrently, B4 high causes $V_{REF}$ to be applied to capacitor C4 causing V1 to be raised by $V_{REF}/4$. As already discussed above, successive-approximation techniques for producing a digital output corresponding to the analog input are known and need not be further detailed. Suffice it to say that the binary bits corresponding to the analog value of $V_X$ are generated by programmer 27. Shortly, after time $t_5$, the state of the comparator output sensed during each step of the successive approximations and stored in programmer 27 is read-out. This read-out is the binary equivalent of the analog value of the scaled input voltage $V_X$. However, the scaling factor is known, $V_{IN}$ may be automatically produced and/or displayed.

What is claimed is:

1. In a change-redistribution successive-approximation analog-to-digital (A/D) converter having a precision voltage reference ($V_{REF}$), in which said charge-redistribution portion of said converter includes a plurality of charge storing means, to which an unknown analog input voltage may be applied whose maximum rated value is greater than said precision reference voltage ($V_{REF}$), the improvement comprising:
control means including switching means coupled to said plurality of charge storing means for applying said unknown analog input voltage to selected ones of said plurality of charge storing means, during a sampling interval, and for subsequently redistributing the accumulated charge among a different number of said charge storing means for scaling the unknown analog input voltage by a factor approximately equal to the ratio of the value of the precision reference voltage to the maximum rated value of the unknown analog input voltage.

2. In the A/D converter as claimed in claim 1 wherein said charge storing means includes N capacitors, each capacitor having first and second terminals; where N is an integer greater than 2; and wherein said converter includes:
a comparator means having an input and an output;
means connecting the first terminal of each one of said N capacitors to said input of said comparator; and
wherein said control means including switching means includes means for applying said unknown analog input voltage to said second terminal of selected ones of said N capacitors during a sampling interval, including means for, subsequent to the sampling interval, connecting the second terminal of all of said N capacitors to the same potential point for redistributing the charge from said selected ones of said N capacitors onto all of said N capacitors for producing a resultant voltage applied to the input of said comparator which is proportional to the ratio of the capacitance of said selected ones of said N capacitors in the total capacitance of said N capacitors.

3. In the analog to digital converter as claimed in claim 2 wherein said means for applying said unknown analog input voltage to said second terminal of selected ones of said N capacitors includes a programmable scaling means coupled to said second terminals of said capacitors for selectively applying said analog input voltage to said capacitor during said sampling interval.

4. In the analog to digital converter as claimed in claim 3, wherein said programmable scaling means includes settable flip-flops.

5. In the A/D converter as claimed in claim 1 wherein said comparator means includes amplifying means with a feedback switching means connected between the input and output of said amplifying means wherein said feedback switching means is turned-on during a sampling interval.

6. In the A/D converter as claimed in claim 5 wherein said feedback switching means is a complementary transistor transmission gate.

7. In the A/D converter as claimed in claim 6 wherein said means for applying said unknown analog input voltage to said second terminal of said capacitors includes complementary transistor transmission gates.

8. A charge-redistribution successive-approximation analog-to-digital (A/D) converter comprising:
a reference terminal for the application thereto of a precision reference voltage ($V_{REF}$);
an input terminal for the application thereto of an unknown analog input voltage;
N capacitors, each capacitor having first and second terminals; where N is an integer greater than 2;
a comparator means having an input and an output;
means connecting the first terminal of each one of said N capacitors to said input of said comparator; and
means for applying said unknown analog input voltage to said second terminal of selected ones of said N capacitors during a sampling interval, including means for, subsequent to the sampling interval, connecting the second terminal of all of said N capacitors to the same potential point for redistributing the charge from said selected ones of said N capacitors onto all of said N capacitors for producing a resultant voltage applied to the input of said comparator which is proportional to the ratio of the capacitance of said selected ones of said N capacitors to the total capacitance of said N capacitors.

9. The A/D converter as claimed in claim 8 wherein said means for applying said unknown analog input voltage to said second terminal of selected ones of said N capacitors includes a programmable scaling means coupled to said second terminals of said capacitors for selectively applying said analog input voltage to said capacitors during said sampling interval.

10. The A/D converter as claimed in claim 9, wherein said programmable scaling means includes settable flip-flops.

11. The A/D converter as claimed in claim 10 wherein said means for applying said unknown analog input voltage to said second terminal of said capacitors includes complementary transistor transmission gates.

* * * * *